(12) United States Patent
Abdoulin et al.

(10) Patent No.: US 9,374,006 B2
(45) Date of Patent: Jun. 21, 2016

(54) THREE-CHANNEL HIGH-SIDE GATE DRIVER HAVING STARTUP CIRCUIT AND CONFIGURABLE OUTPUTS

(71) Applicants: Edgar Abdoulin, Woodland Hills, CA (US); Jong Deog Jeong, Palos Verdes, CA (US)

(72) Inventors: Edgar Abdoulin, Woodland Hills, CA (US); Jong Deog Jeong, Palos Verdes, CA (US)

( * ) Notice: Subject to any disclaimer, the term of this patent is extended or adjusted under 35 U.S.C. 154(b) by 4 days.

(21) Appl. No.: 14/523,839

(22) Filed: Oct. 24, 2014

(65) Prior Publication Data

US 2016/0118885 A1   Apr. 28, 2016

(51) Int. Cl.
*H01L 29/66* (2006.01)
*H02M 3/158* (2006.01)
*H02J 1/00* (2006.01)

(52) U.S. Cl.
CPC . *H02M 3/158* (2013.01); *H02J 1/00* (2013.01)

(58) Field of Classification Search
CPC ............... H02H 7/0838; H01L 2924/1305; H01L 2924/13091; H02M 7/003; H02M 7/53803; H02P 7/0044; H02P 27/06; H03K 17/6872
USPC ............ 257/372, 379, 401, 287, 288; 307/31; 323/271
See application file for complete search history.

(56) References Cited

U.S. PATENT DOCUMENTS

| | | | | |
|---|---|---|---|---|
| 6,002,213 A | * | 12/1999 | Wood | H02M 1/08 315/307 |
| 6,943,533 B2 | * | 9/2005 | Okuno | H02M 3/1588 323/222 |
| 7,671,638 B2 | * | 3/2010 | Giandalia | H01L 27/0255 327/108 |
| 2002/0084809 A1 | * | 7/2002 | Okuno | H02M 3/1588 327/108 |
| 2005/0012689 A1 | * | 1/2005 | Abdoulin | G09G 3/2965 345/60 |
| 2012/0025794 A1 | * | 2/2012 | Inoue | H02M 3/158 323/271 |

* cited by examiner

*Primary Examiner* — Duy T Nguyen
(74) *Attorney, Agent, or Firm* — Angus C. Fox, III

(57) ABSTRACT

A driver circuit includes three non-contiguous high-voltage wells formed within a low-voltage monolithic silicon substrate; a high-side driver circuit fabricated within each of the wells; a separate logic input path for each of the high-side driver circuits, each input path comprising a logic signal input terminal, a signal amplifier, a noise filter, a pulse generator, and a high-voltage level shifter; an output terminal for each driver circuit, each output terminal coupled to its associated driver circuit output through a separate mask-configurable, variable-value output resistor bank, which reduces the number of external components needed for driver circuitry; a startup circuit which prevents operation of an associated high-side switch during periods of line voltage instability; and embedded capacitor banks, each of which is in close proximity to a high-side switch, for reducing capacitive, resistive and inductance losses associated with long metal lines.

20 Claims, 13 Drawing Sheets

THREE-CHANNEL HIGH-SIDE GATE DRIVER HAVING STARTUP CIRCUIT AND CONFIGURABLE OUTPUTS

FIELD OF THE INVENTION

The present invention relates, generally, to gate drivers for high-power insulated-gate bipolar transistors and metal-oxide-semiconductor field-effect transistors and, more specifically, to monolithic high-side gate drivers having configurable outputs.

BACKGROUND OF THE INVENTION

High-power transistors are commonly used as load switches for a wide variety of applications. A high-side load switch is one that it is controlled by an external enable signal, and connects or disconnects a power source to a given load. A low-side load switch, on the other hand, connects or disconnects the load to g round, and therefore sinks current from the load.

When a transistor is switched on or off, it does not immediately switch from a non-conducting to a conducting state; and may transiently support both high voltage and high current. Consequently, when current is applied to the gate of a transistor to cause it to switch, a certain amount of heat is generated which can, in some cases, be sufficient to destroy the transistor. Therefore, it is necessary to keep the switching time as short as possible, so as to minimize switching losses. Typical switching times are in the range of microseconds. The switching time of a transistor is inversely proportional to the amount of current used to charge the gate. Therefore, switching currents are often required in the range of several hundred milliamperes, or even in the range of amperes. For typical gate voltages of approximately 10-15V, several watts of power may be required to drive the switch. When large currents are switched at high frequencies, (e.g. in DC-to-DC converters of large electric motors), multiple transistors are sometimes provided in parallel, so as to provide sufficiently high switching currents and switching power.

Switching signals for a high-power transistors are usually generated by a logic circuit or a microcontroller, which provides an output signal that typically is limited to a few milliamperes of current. Because high-power transistors generally require drive inputs having current demands far greater than those provided by low voltage logic signals generated by logic circuits and microcontrollers, gate drivers must be provided to control high-power transistors. A gate driver is a power amplifier that accepts a low-power input from a controller IC and produces a high-current drive input for the gate of a high-power transistor such as an insulated-gate bipolar transistor ("IGBT") or power metal-oxide-semiconductor field-effect transistor ("MOSFET"). Gate drivers can be provided either on-chip or as a discrete module.

In summary, a gate driver's primary function is to deliver the correct amount of charge to the power switch quickly. An important secondary function of a gate driver is to act as a signal translator, by converting low level on/off signals from a low power circuit provided, for example, by a microprocessor, to higher power levels required to operate the power switch. Gate drivers are offered in various input configurations and power levels to operate different types and sizes of power switches. Larger power switches require gate drivers with larger driving capability. In addition to the above capabilities, high-voltage gate drivers allow circuits to operate in off-line environments. Applications for high-voltage gate drivers consist of motor control circuits used in appliances as well as industrial drives, off line switching power supplies, un-interruptible power sources, high-end adapters, lighting circuits (CCFL, CFL, LED) and many more.

High-side integrated gate drivers are used in applications requiring the switching of power MOSFET and/or IGBTs when used as high-side switches. FIG. 1 shows a load 101 having a path 102 to ground (the low side) and a connection to a high-voltage power supply 103 through a high-side switch 104. A pulsating output at terminal 7 of a controller chip 105, which is controlled by a square wave pulse generator 106 input at terminal 2, charges the gate 107 of high-side switch 104 (in this particular case, an N-channel enhancement-mode, insulated-gate, field effect transistor, or IGFET) through a resistor 108. The controller chip 105 is configured so that node 109 is connected to ground via a current path between terminals 3 and 6 when the load 101 is disconnected from the high-voltage power supply 104 (i.e., when the channel of high-side switch 104 is not conducting). The battery 110 provides a voltage to charge the gate 107 of high-side switch 107 to the required level.

IGFETs, or MOSFETs as they are frequently called, are invariably selected as gate drivers because, in contrast to bipolar transistors, MOSFETs do not require constant power input to remain in a conducting or non-conducting state. The insulated gate-electrode of the MOSFET functions as a capacitor, which must be charged or discharged each time the MOSFET is switched on or off. As such a transistor requires a particular gate voltage in order to switch on, the gate capacitor must be charged to at least the required gate voltage for the transistor to be switched on. Similarly, to switch the transistor off, this charge on the gate capacitor must be dissipated. Thus a MOSFET gate driver requires the application of control power only during the short time that it takes to charge the gate electrode to an optimum threshold voltage that is required for conduction to be induced in the channel of the MOSFET. The gate drive voltage is turned on for a period of time determined by the system duty cycle. The duty cycle period is of sufficient length so that the insulated gate of the driver transistor will be charged to the optimum threshold voltage. Once the gate capacitor is charged, it draws no further power, and the transistor remains in an ON state until charge on the gate is dissipated. Because gate drive voltage is typically a few volts above the power rail voltage, a separate power source must be available to provide the energy to charge the gate of the high-side driver sufficiently to render it conductive. This supply is referred to as a "bootstrap supply". If the bootstrap supply is of a dc-dc converter type, then the high-side switch can be maintained on indefinitely. When used to control current flow in a three-phase brushless DC motor, the high-side switch must be turned on and off for each revolution of the motor. Thus, the capacitor must be recharged after it charge is applied to the gate electrode of the high-side switch. In FIG. 2, a charging path 201 and a low-side switch block 204 have been added to the schematic diagram of FIG. 1. It should be understood that whenever high-side switch 104 is conducting, the low-side switch is not. The low-side switch transistor 205 is controlled by the pulses generated by low-side pulse generator 206. Those pulses are passed to the insulated gate 207 of low-side switch transistor 205 through an amplifier 208 and a resistor 209.

Still referring to FIG. 2, the bootstrap charging path couples VDD to both terminal 8 of the controller chip 105 and to the positive plate of a bootstrap capacitor 203. The presence of a diode 202 in the charging path 201 prevents the discharge of the capacitor 203 back to VDD. The negative plate of capacitor 203 is coupled to the load 101 and to terminal 6 of the controller chip 105. In response to the rising edge of each pulse from high-side square wave pulse generator 106 received at terminal 2, the controller chip 105 interconnects terminals 7 and 8, thereby dumping the charge on capacitor 203 to the insulated gate of the high-side switch 104. After a set time sufficient for the gate 107 to charge to its optimum level, the controller chip 105 breaks the connection between terminals 7 and 8. The gate electrode 107 remains charged. When the trailing edge of each pulse from the pulse generator 106 causes the controller chip 105 to short terminal 7 to ground terminal 3 and dissipate the charge on insulated gate 107, conduction through the high-side switch 104 stops. Node 109 is maintained at ground level through low-side switch transistor 205 while the capacitor 203 charges. When the charge on gate 207 goes low, low-side switch transistor 205 stops conducting and node 109 becomes isolated. The cycle begins anew as the charge on capacitor 203 is again sent to the insulated gate 107 of high-side switch transistor 104.

Typical application for high-side gate drivers include, but are not limited to, appliance motor drivers, industrial motor controllers, lighting systems and multiple phase power supplies. Since these types of gate drivers are used in high voltage and high power systems, protection of the external system as well as maintaining a safe environment are of utmost importance.

Three-phase alternating current induction motors were developed independently by Galileo Ferraris, Mikhail Dolivo-Dobrovolsky and Nikola Tesla in the late 1880s. In a balanced three-phase power supply system (by far, the most common type), three conductors each carry an alternating current of the same frequency and voltage relative to a common reference (such a reference is typically connected to ground and often to a current-carrying conductor called the neutral) but with a phase difference of one third the period; hence the voltage on any conductor reaches its peak at one third of a cycle after one of the other conductors and one third of a cycle before the third conductor. From any of the three conductors, the peak voltage on the other two conductors is delayed by one third and two thirds of one cycle respectively. This phase delay gives constant power transfer over each cycle, and results in a rotating magnetic field in an electric motor's stator. In an induction motor, electric current in the rotor windings needed to produce torque is obtained by electromagnetic induction from the magnetic field of the stator winding. So that induction can occur, an induction motor's rotor rotates about 95 percent of synchronous speed (a five percent slip rate from sychronicity). A three-phase synchronous motor does not rely on slippage, but employs permanent magnets mounted on the rotor. Three-phase motors are known for their high efficiency (as high as 95 percent) and small size.

For small-motor applications many appliance designers favor modern three-phase brushless DC (BLDC) motors because of their high efficiency and small size per horsepower of output. A BLDC motor can, indeed, be 3-phase, which refers to the number of electrical phase windings on the motor. Power inputs are switched via a three-phase power "bridge" from a DC voltage supply. This "bridge" consists of 6 power devices, which are generally IGBTs, but sometimes MOSFETs. Square wave power pulses are delivered to each of the three phase windings on the stator. Pulse-width modulation is used to control the power output, and the order in which the three motor phases are energized determines the direction of rotor rotation. In order to ensure safe operation under any load condition, designers must carefully design control logic to address torque, speed control, and power-delivery issues.

SUMMARY OF THE INVENTION

Motor control circuits for three-phase brushless DC motors require three independent half bridge drivers to apply electrical power to the three-phase windings of the motor at predefined intervals. The high-side driver circuit disclosed herein provides one half of the drive section for three-phase motor control, and includes three high-side drivers on a monolithic structure, thereby allowing circuit designers freedom to choose the remaining low-side drive components to suit a variety of applications, including but not limited to custom protection circuits as required by the final design.

The high-side driver circuit includes three non-contiguous high-voltage wells formed within a monolithic, low-voltage, silicon substrate. A high-side driver circuit is fabricated within each of the wells, with each driver circuit having a separate logic input path. Each logic input path a logic signal input terminal, a signal amplifier, a noise filter, a pulse generator, and a high-voltage level shifter. Each driver circuit also has its own output terminal that is coupled to its associated driver circuit output through a mask-configurable, variable-value output resistor bank, which reduces the number of external components needed for driver circuitry. A startup circuit prevents operation of an associated high-side switch during periods of line voltage instability. One of the three driver circuits is intended to be installed in close proximity to its associated high-side switch. Each of the other two driver circuits, which are expected to be more distant from their associated high-side switches, has an embedded capacitor bank, whose function is to reduce capacitive, resistive and inductance losses associated with long metal lines. The embedded capacitor banks also help to eliminate occurrences of false under-voltage lockouts.

Each high-side driver section incorporates a novel startup circuit that prevents motor operation before line voltage has stabilized at a level sufficiently high to enable the high-side drivers to completely turn on and turn off the high-voltage switches. Thus damage to the motor winding and to the drive circuitry is averted. The start-up circuit also ignores minor disturbances, or perturbations, in line voltage which have a duration shorter than a set, predetermined time interval, but will disable driver output if such voltage disturbances have a duration greater than the set, predetermined time interval.

Output resistances are adjustable during fabrication through the use of a custom metal mask, which can select a portion or all of the resistive elements in a resistor bank associated with each high-side driver, thereby reducing the number of external components needed for driver circuitry. This feature results in more compact, lower-cost motor control systems.

PREFERRED EMBODIMENT OF THE INVENTION

Three-phase DC brushless motors are the most widely produced type of DC motors. This refers to the number of electrical phase windings on the motor. It is switched via a three-phase power "bridge" from a DC voltage supply. This "bridge" consists of 6 power devices—normally IGBTs, but sometimes MOSFETs. They use pulse-width modulation to control the power, and the order in which the three motor phases are energised determines the direction of rotation.

The present invention provides a high-side driver circuit having three identical high-side driver channels which can be used as three independent drivers either in a continuous "on" mode with a proper DC power source or used in pulsed on/off operation mode with capacitors as boot-strap supplies and independent low side sections to charge them.

The high-side driver circuit will now be described in detail with reference to the attached drawing figures.

Figure 3:
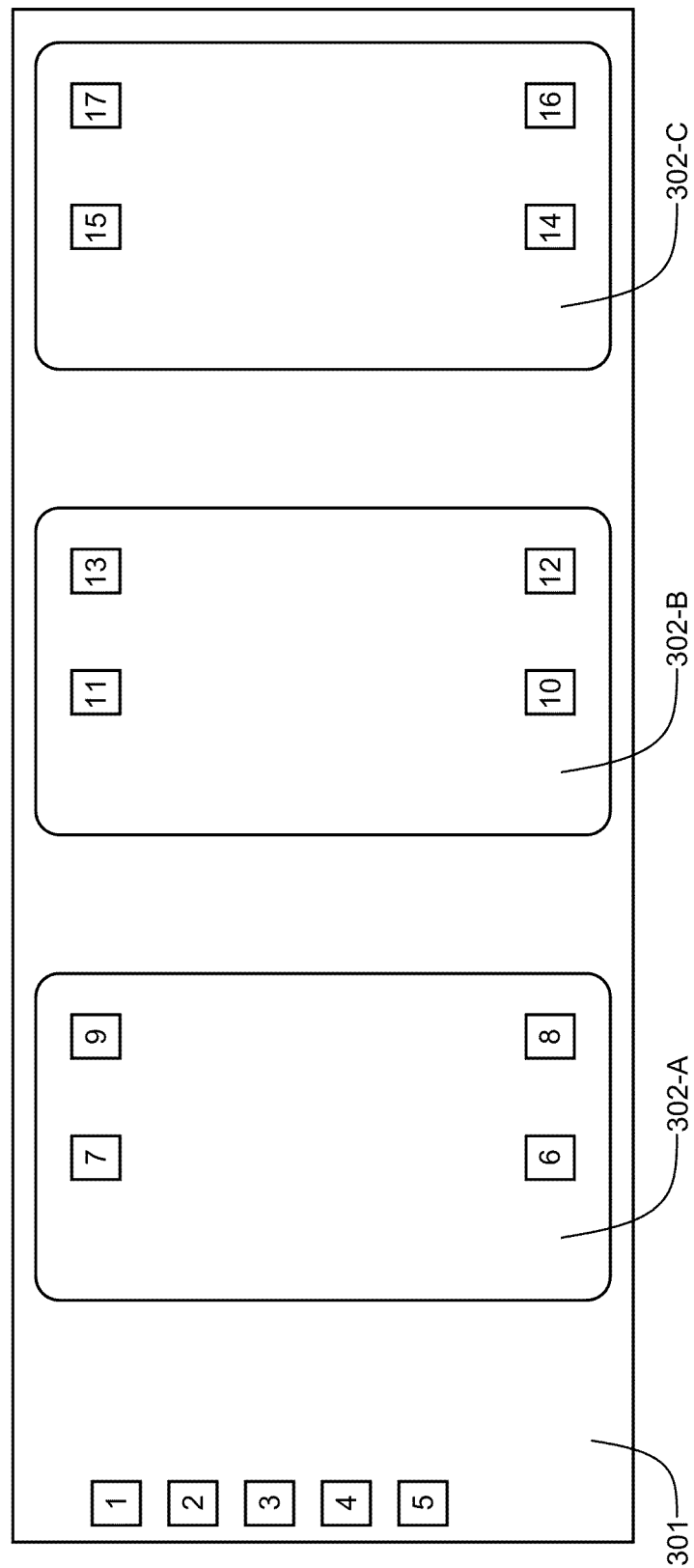
FIG. 3 is a map of the high-side drive circuit die, showing pad locations.

Referring now to FIG. 3, a map of the three-channel, high-side driver circuit die shows three non-contiguous high-voltage wells 302-A, 302-B and 302-C which have been formed within a monolithic, low-voltage, silicon substrate 301. Duplicate pads are provided on opposite sides of the die. The following table identifies the various numbered pads by symbol and functional description.

| Pin No. | Symbol | Description |
| --- | --- | --- |
| 1 | HIN3 | Logic Input for Chan. 3 high-side driver |
| 2 | HIN2 | Logic Input for Chan. 2 high-side gate driver |
| 3 | HIN1 | Logic Input for Chan. 1 high-side gate driver |
| 4 | VCC | Power Supply |
| 5 | COM | Power Supply Return |
| 6, 7 | VS1 (A & B) | Floating Power Supply Return for Chan. 1 |
| 8 | HO1 | Floating Gate Driver Output for Chan. 1 |
| 9 | VB1 | Floating Power Supply for Chan. 1 |
| 10, 11 | VS2 (A & B) | Floating Power Supply Return for Chan. 2 |
| 12 | HO2 | Floating Gate Driver Output for Chan. 2 |

-continued

| Pin No. | Symbol | Description |
| --- | --- | --- |
| 13 | VB2 | Floating Power Supply for Chan. 2 |
| 14, 15 | VS3 (A & B) | Floating Power Supply Return for Chan. 3 |
| 16 | HO3 | Floating Gate Driver Output for Chan. 3 |
| 17 | VB3 | Floating Power Supply for Chan. 3 |

It should be understood that HIN1 and HO1 are in phase, HIN2 and HO2 are in phase, and HIN3 and HO3 are in phase. The use of duplicate pads for the same function enables designers to minimize the length of connections to power switches, sources and returns when designing complete motor control circuits, thereby reducing parasitic components in those connections and lowering operating noise associated with such components. Thus, sensitive applications can benefit from enhanced operational efficiency.

Figure 4:
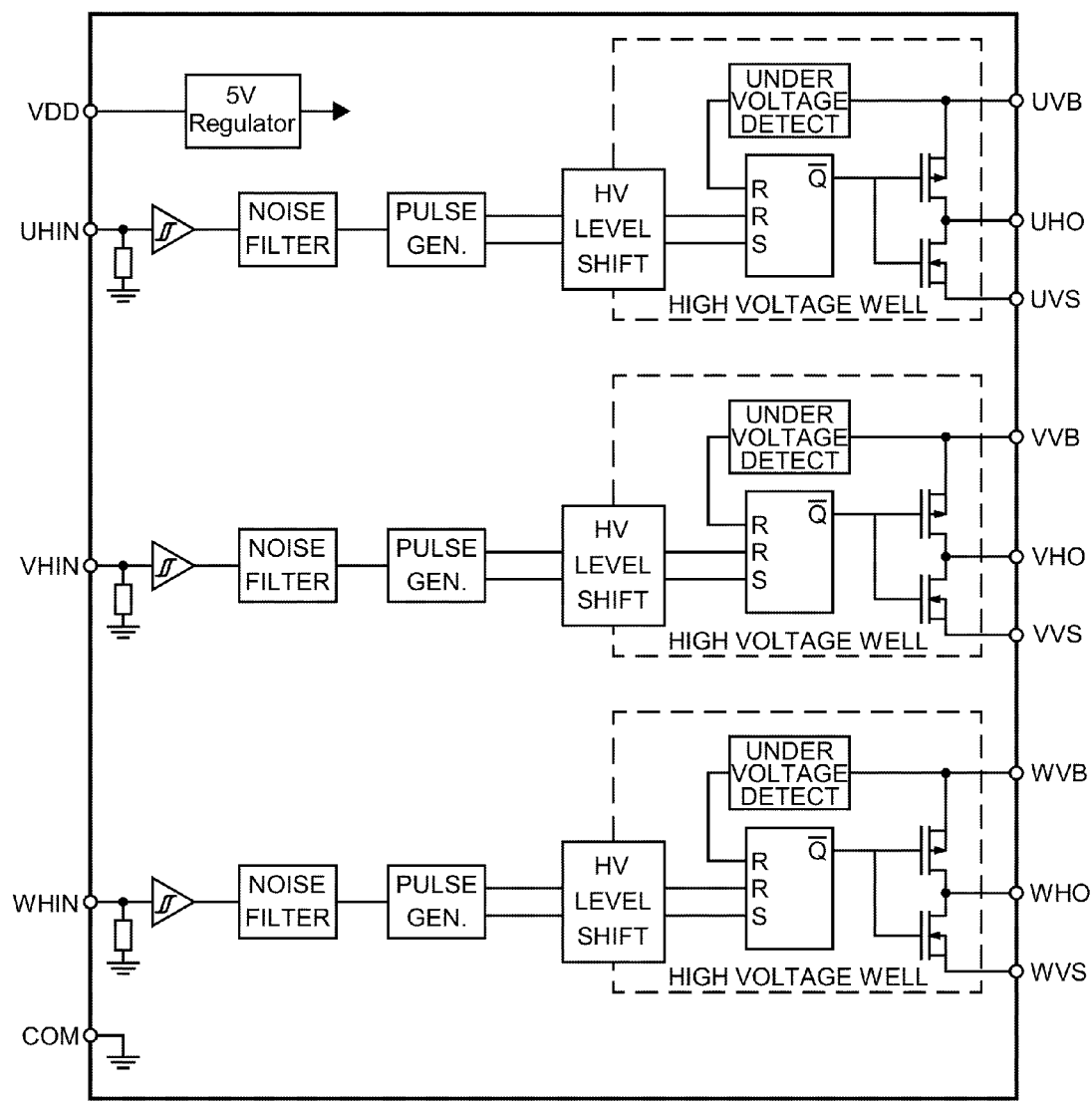
FIG. 4 is a block diagram of the three-channel high-side driver circuit.

Referring now to the block diagram of FIG. 4, each driver channel includes multiple identical components which are labeled with an extension A, B or C, which refer to components of channels 1, 2 and 3, respectively. When referring to the components, without specifying a particular channel, the extensions are eliminated from the item numbers. Those components includes an input terminal (HIN1, HIN2, HIN3), a Schmitt trigger 401, a noise filter 402, a pulse generator 403, a high-voltage level shift module 404, and a half-bridge driver module 302, which includes an P-channel IGFET 405, an N-channel IGFET 406-A, 406-B and 406C (406 generally), a gate controller module 407, and an under-voltage detect module 408. As heretofore defined, VB is the floating power supply, HO is the floating gate driver output, and VS is the floating power supply return.

Figure 1:
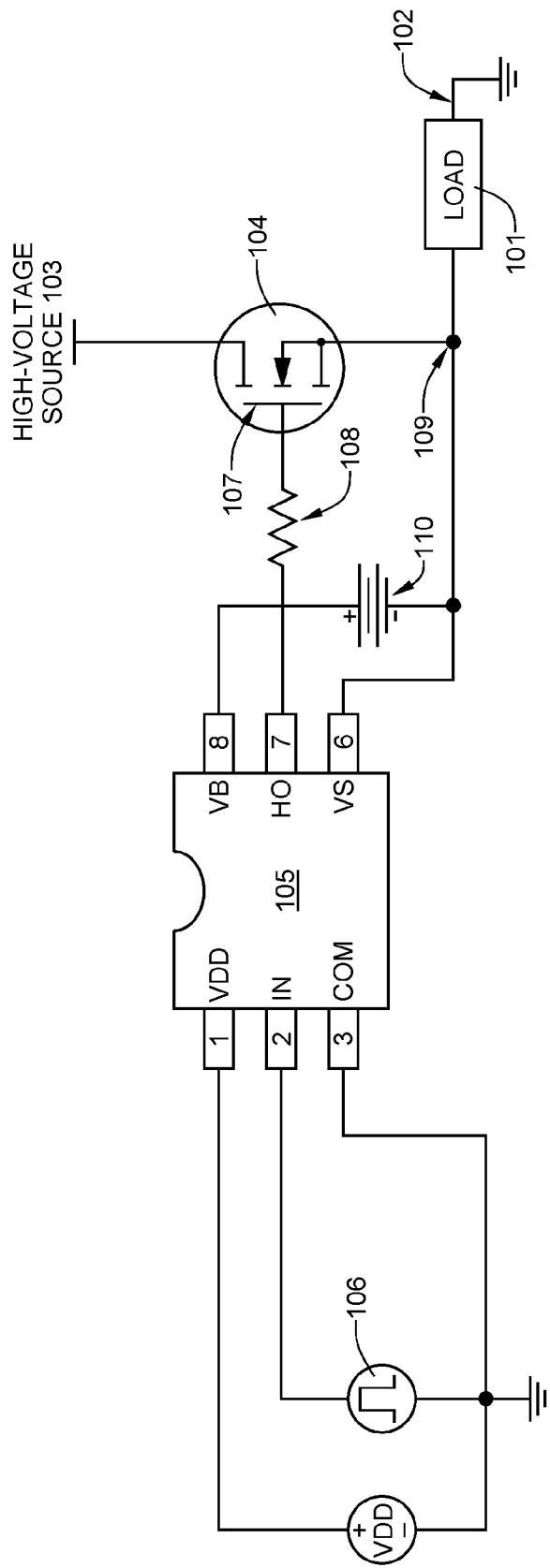
FIG. 1 is a circuit diagram of a load having both a power sinking path to ground and a connection to a high-voltage power supply through a high-side switch that is controlled by a controller chip.
Figure 2:
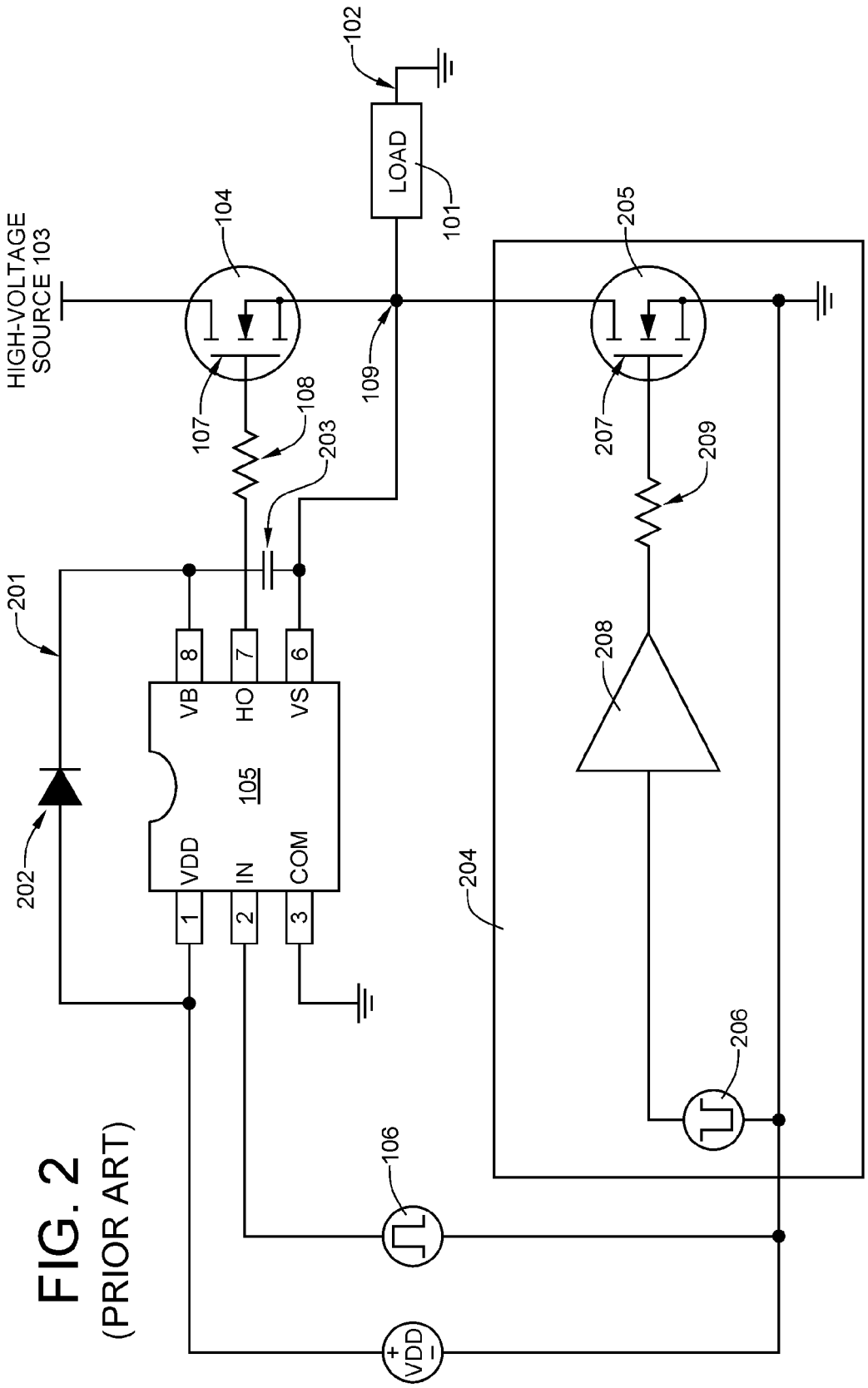
FIG. 2 is a circuit diagram of a typical high-side switch application with a driver having a bootstrap capacitor power source that is enabled by a pulsed on/off routine.
Figure 5:
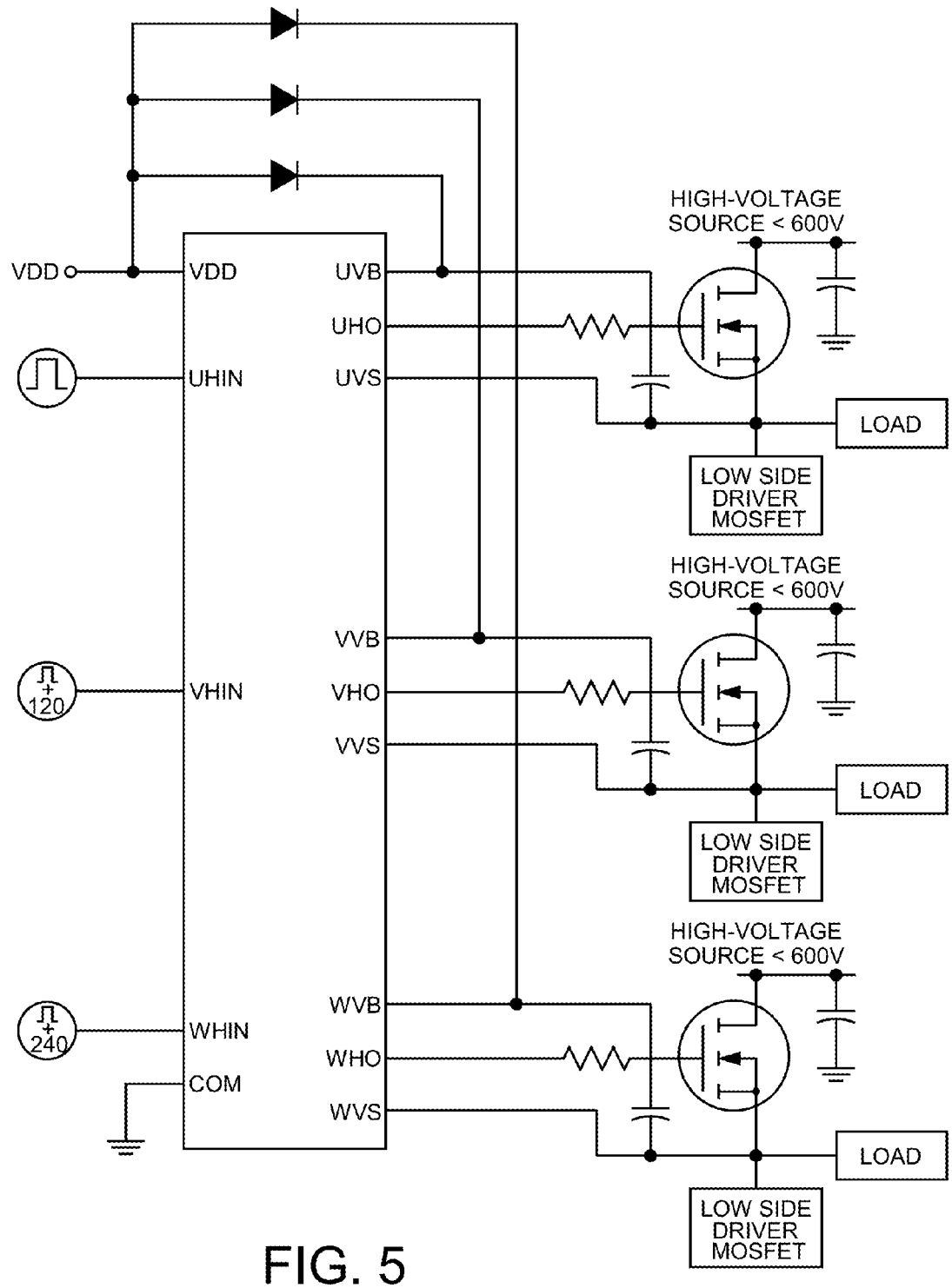
FIG. 5 is a schematic diagram showing the high-side driver circuit packaged as a Small Outline Integrated Circuit ("SOIC") used in combination with other circuit components in a typical high-side switch application.

Referring now to FIG. 5, this schematic circuit diagram shows the high-side driver circuit packaged as a Small Outline Integrated Circuit ("SOIC"), and used in combination with other circuit components in a typical high-side switch application. In its most basic configuration, the schematic circuit diagram of FIG. 5 essentially comprises three of the circuits of FIG. 2, with all of the high-side drivers being located on a single monolithic silicon die. Other than the three drivers being on a single die, the other unique features of the chip, such as the presence of duplicate input/output pads, filtering of inputs, mask-configurable output resistor banks, under-voltage detection circuitry, and on-chip capacitor banks are not shown in this drawing figure.

Figure 6:
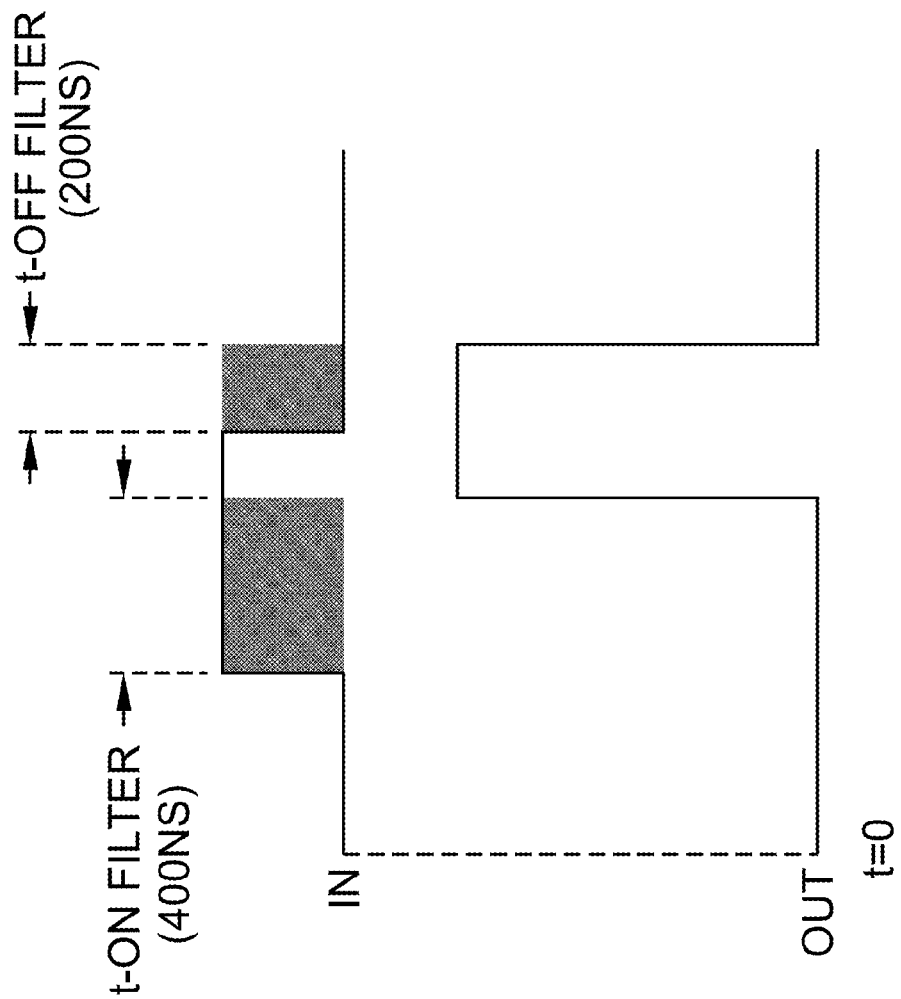
FIG. 6 is a graph of both turn-on and turn-off pulse trains, showing the different noise filter requirements for each.

To avoid false startups or false triggering of the output drivers, the three-driver device employs special noise filtering in the inputs to eliminate noise that is present in applications where this device is utilized. FIG. 6 shows that input pulses have to meet certain minimum width requirements before they are applied to the outputs. It will be noted that minimum pulse width requirements are different for turn-on an turn off pulses with the turn-on pulse having a more stringent requirement due to the application of the high voltage power source to the load in this phase. A false application of the high power source might damage the load and cause system failures. In order for output to change to a high state, the input pulse width must remain at a high state for at least 400 nanoseconds. In order for output to change to a low state, the input pulse must remain low for at least 200 nanoseconds. If the turn-on or turn-off pulses are shorter than the 400 and 200 nanoseconds which are respectively required, the output will remain unchanged.

Figure 7:
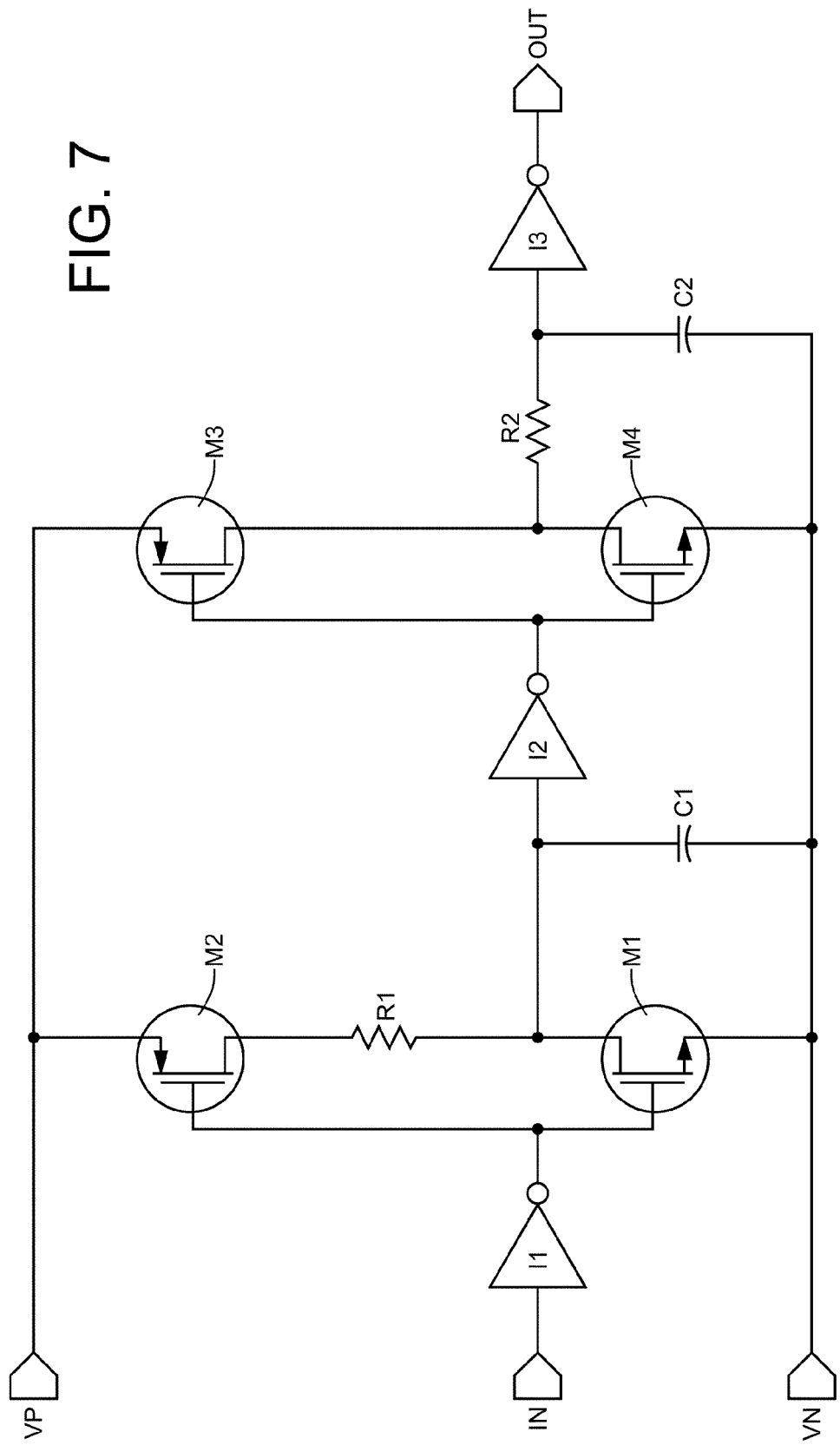
FIG. 7 a schematic circuit diagram of the input noise filter.

Referring now to FIG. 7, the noise input filter has two circuit sections. The first circuit section comprises transistors M1 and M2, resistor R1 and capacitor C1. The second circuit section comprises transistors M3 and M4, resistor R2 and capacitor C2. The first functions in the following manner: A positive input at the IN terminal causes transistor M1 to turn off and transistor M2 to turn on, which causes capacitor C1 to charge from the power source VP through resistor R1. When the voltage across capacitor C1 reaches the threshold voltage of inverter I2, inverter I2 changes state and turns off transistor M4 and turns on transistor M3, which causes capacitor C2 to charge through resistor R2. After capacitor C2 reaches the threshold voltage of inverter I3 the output of inverter I3 changes to positive, with each circuit section delaying the input pulse by one half of required time delay on positive going inputs. When the signal at the IN terminal changes from high to low, transistor M1 turns on and transistor M2 turns off, which causes capacitor C1 to rapidly discharge through transistor M1. This causes a change in the output state of inverter I2, thereby turning off transistor M3 and turning on transistor M4, which causes capacitor C2 to discharge through both resistor R2 and transistor M4. When the voltage across capacitor C2 goes below the threshold of inverter I3 the output at OUT changes state. As can be seen form the operation, a positive going pulse causes both circuit sections to contribute to the time delay, whereas a negative going pulse causes a delay that is only half as large before the a change of state is reflected in the output state.

Figure 8:
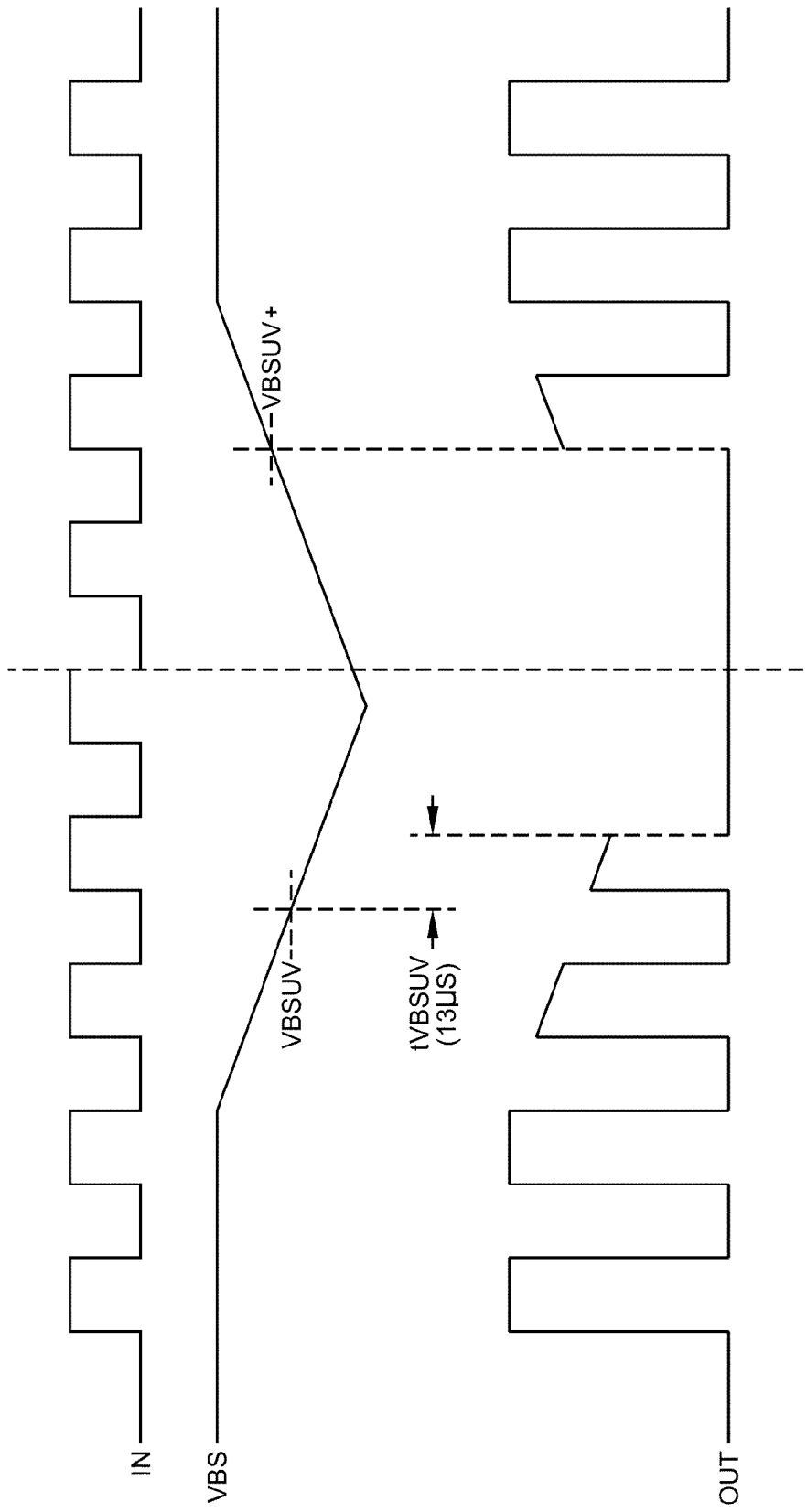
FIG. 8 is a graphic representation of under-voltage lockout, which imposes a wait period before turning off the high-side driver circuit.

Referring now to FIG. 8, three related graphs are shown: a square wave logic input IN, a supply voltage input VBS, and an output OUT. The high-side driver circuit prevents turning on the output OUT to the external high-side switches whenever the supply voltage is below a level VBSUV that is deemed sufficient to efficiently operate the external switches. The circuit also ignores any perturbations in the power source VBS that occur for a period that is less than a predetermined undervoltage time interval tVBSUV, which has been set at 13 microseconds. The output remains off, however, if the supply voltage VBS does not return to the minimum required voltage within that time period. The circuit imposes an under-voltage lockout on the output until the minimum voltage level is restored.

Figure 9:
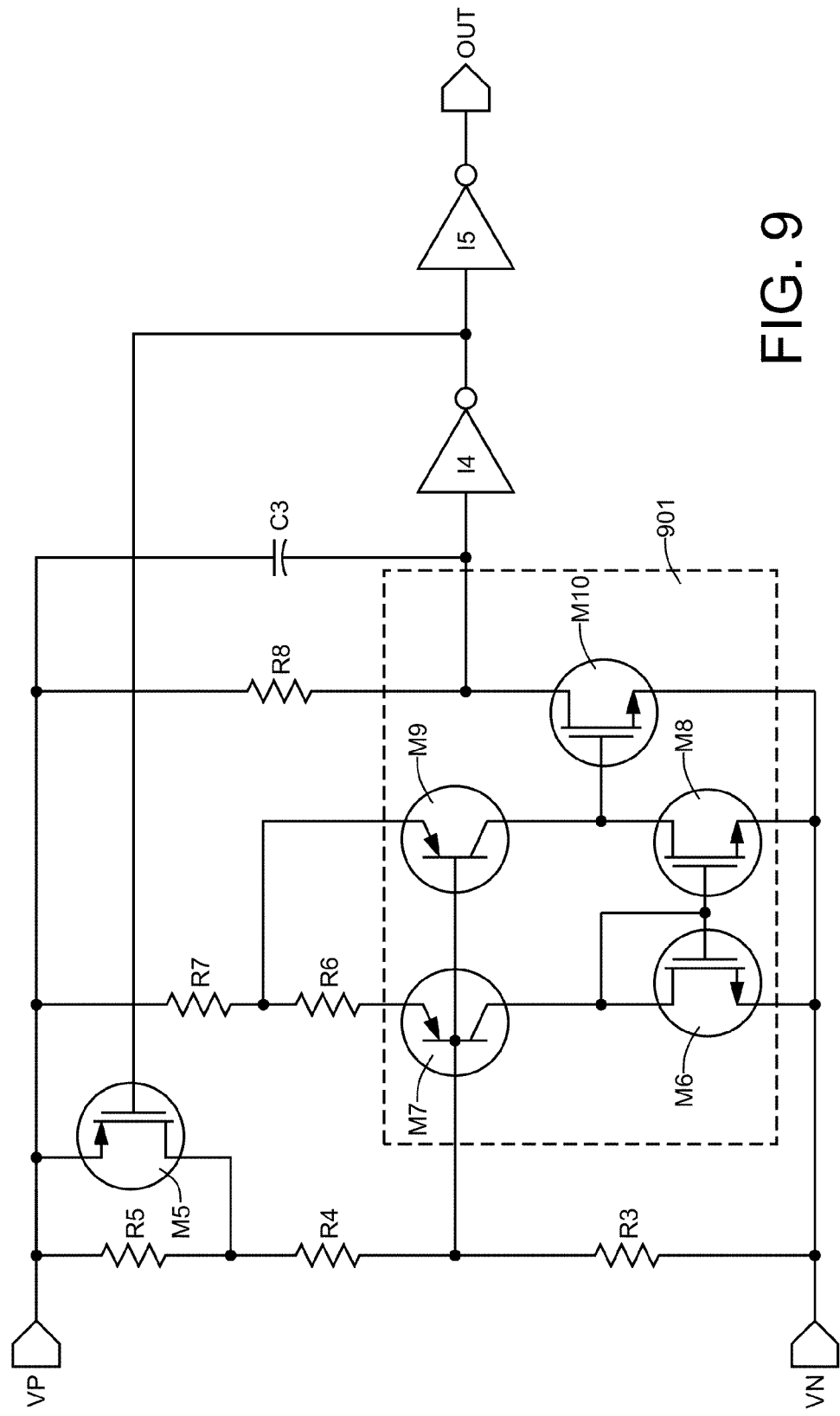
FIG. 9 is a schematic circuit diagram of the under-voltage lockout circuit, showing the timing components which result in non-symmetric turn-on and turn-off.

Referring now to FIG. 9, timing components in the under-voltage circuit create non-symmetric turn-on and turn-off threshold voltage values. A comparator 901, constructed from transistors M6, M7, M8, M9, and M10, has an input threshold voltage set by the resistor ladder formed by resistors R3, R4 and R5. Initially, transistor M5 is on, with R5 shorted and, effectively, not part of the circuit. Under those conditions, the threshold voltage is set by only resistors R3 and R4. When VP goes high, causing the input to comparator 901 to exceed the threshold voltage, transistor M10 turns on, causing the output of the comparator 901 to go high, and the output of inverter I4 to go low. The low output from inverter I4 turns transistor M5 off, thereby altering the input threshold of comparator 901 by adding resistor R5 to the resistor ladder. Capacitor C3 acts as a time delay for modifying the threshold values so as to eliminate unwanted changes in outputs due to small perturbations in VP.

Figure 10:
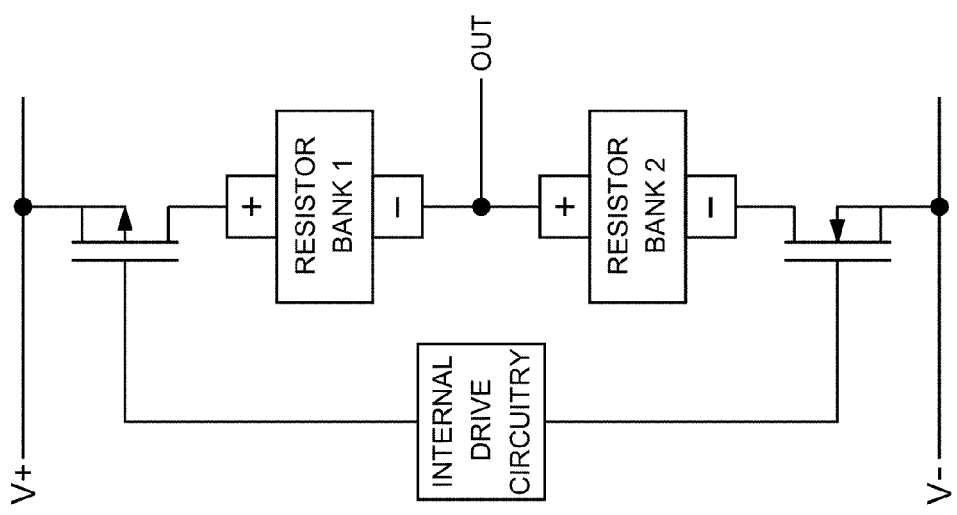
FIG. 10 is a circuit diagram of the mask-selectable output resistor arrangement.

Output resistances are adjustable during fabrication through the use of a custom metal mask, which can select a portion or all of the resistive elements in a resistor bank associated with each high-side driver, thereby reducing the number of external components needed for driver circuitry. This feature results in more compact, lower-cost motor control systems. FIG. 10 shows the location of these resistor banks in the output circuitry. Whereas FIG. 4 is simply a basic block diagram of the high-side driver circuit, FIG. 10 shows more circuit detail between the drains of the N-channel IGFETs 406 and the P-channel IGFET 405 and the output to the gate of the high-voltage switch. FIG. 10 shows how a resistor bank is positioned in series between the output and the drain of each IGFET 405 and 406. The use of duplicate resistor banks allows the selection of independent on and off resistor values, thereby allowing different charge and discharge rates for the switch gates of the external high-voltage switches. Asymmetric charge and discharge rates can be used to avoid overlap between external high and low side switches and to avoid destructive shoot-through currents.

Figure 11:
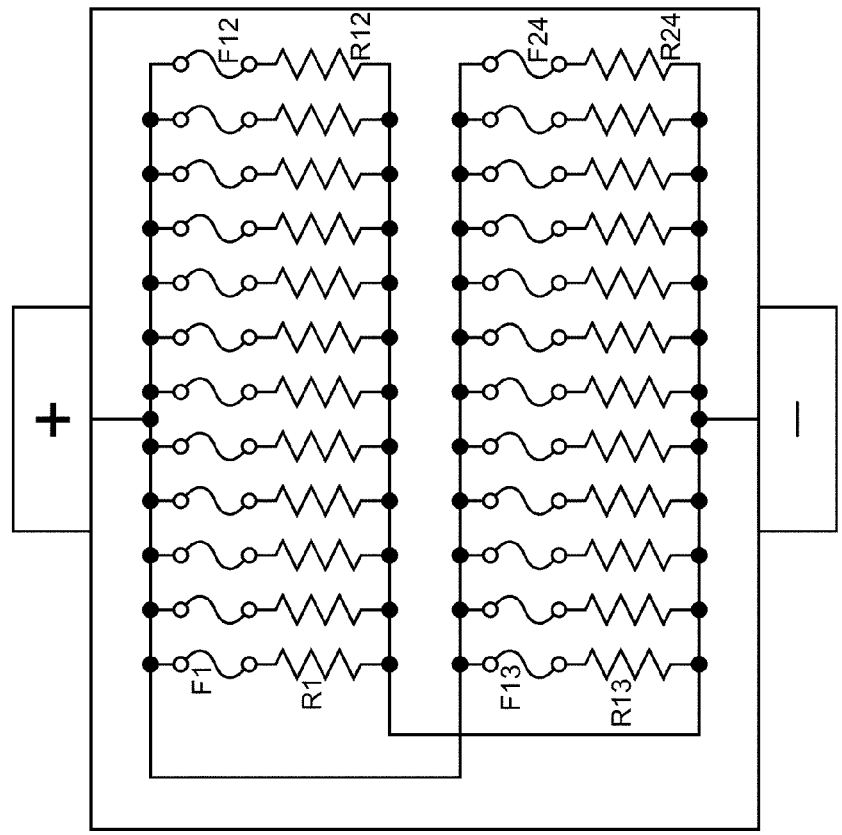
FIG. 11 is a circuit diagram of a selectable output resistor bank, shown with some segments shorted out of the circuit.

Referring now to FIG. 11, the physical organization of each resistor bank is shown. In this drawing figure, there are two sets of twelve resistors R1-R12 and R13 to R24. Though located in two rows, all of the resistors are in a parallel relationship. Each resistor has associated therewith a trace, or fuse, F1-F24 that can be eliminated (e.g., etched away) during the chip manufacturing process in order to create an open connection to the respective resistor. Thus, with no traces eliminated during manufacture, resistance of the path from the IGFET drain to the output is at a minimum. Resistance of the path can be increased by eliminating one or more traces F1-24. or during chip manufacture by the use of a special programming mask.

Figure 12:
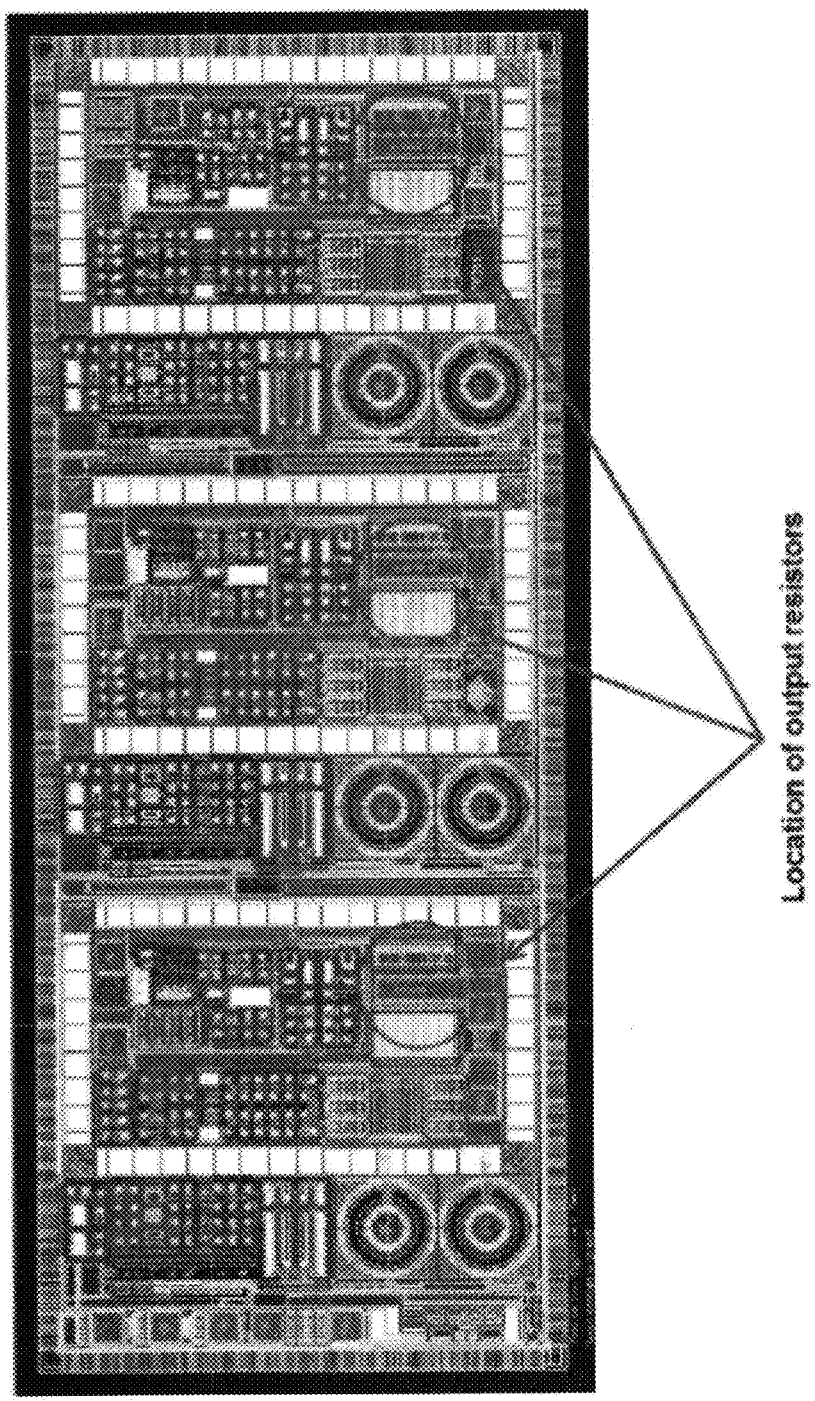
FIG. 12 is a top plan view of the high-side driver circuit die, showing the locations of the mask-programmable output resistor banks.

Referring now to FIG. 12, this top plan view of the high-side driver circuit die shows the locations of the mask-programmable output resistor banks, which are shown schematically in FIG. 11.

Figure 13:
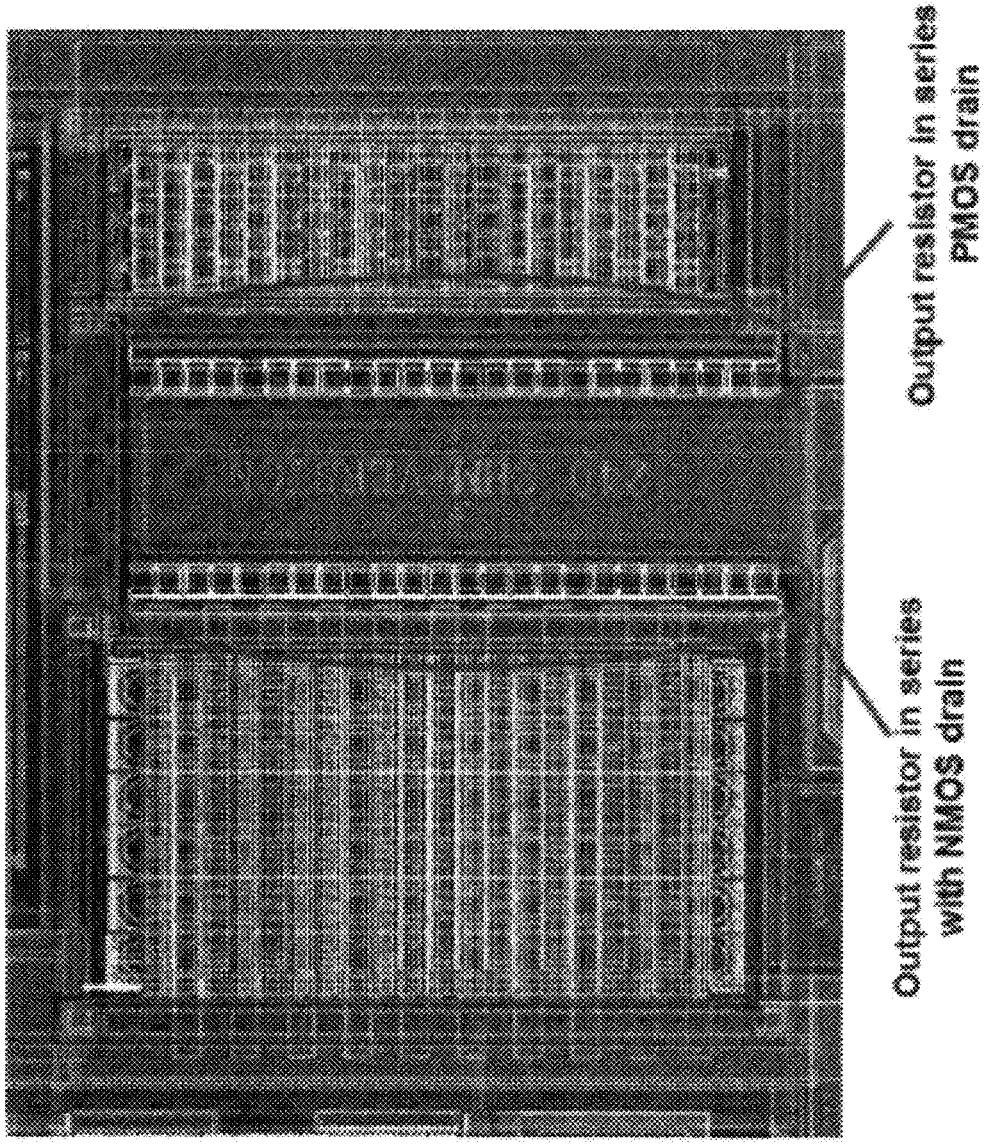
FIG. 13 is a closeup of one of the resistor banks on the high-side driver circuit die, as shown in FIG. 12, showing half of each resistor bank comprises resistors in series with an NMOS drain and with the other half being in series with a PMOS drain.

Referring now to FIG. 13, the resistor banks for one of the three driver channels on the high-side driver circuit die have been further magnified to show the output resistors, which are in series with the NMOS drain a single output a single resistor bank of the three identified in FIG. 12 has been magnified to show greater detail. The resistor bank on the left is in series with the drain of the N-channel IGFET 406 (see FIG. 4) and the resistor bank on the right is in series with the drain of the P-channel IGFET 405 (see FIG. 4).

Figure 14:
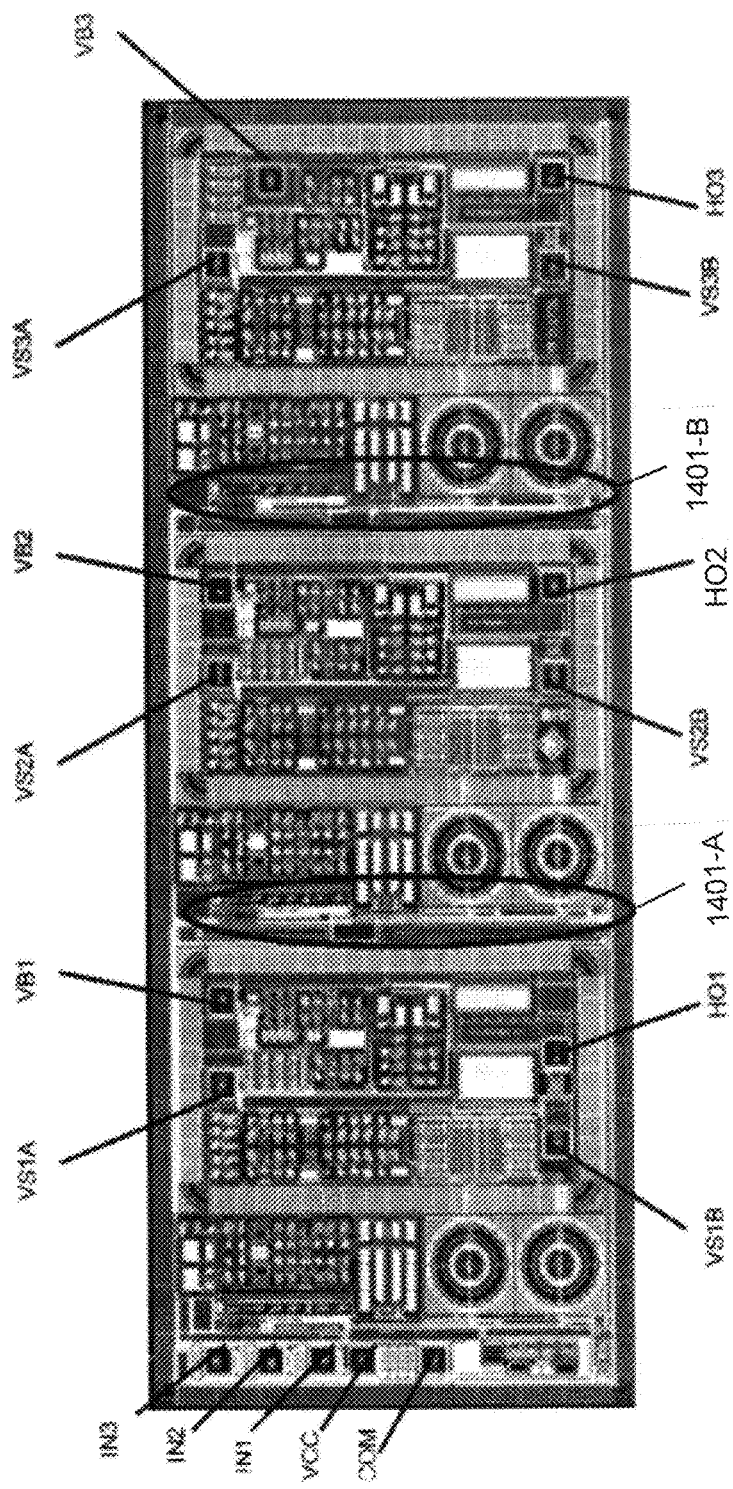
FIG. 14 is a top plan view of the three-channel high-side driver circuit die, showing embedded capacitor banks.

Referring now to FIG. 14, embedded capacitors are provided within close proximity of each high-side switch to reduce losses due to long metal lines. It will be noted that only two of the high-side driver channels are equipped with embedded capacitors. One of the three driver circuits is intended to be installed in close proximity to its associated high-side switch. Each of the other two driver circuits, which are expected to be more distant from their associated high-side switches, has an embedded capacitor bank, whose function is to reduce capacitive, resistive and inductance losses associated with long metal lines. The embedded capacitor banks also help to eliminate occurrences of false under-voltage lockouts.

Although only a single embodiment of the three-channel high-side gate driver having a startup circuit and configurable outputs has been shown and described, it will be obvious to those having ordinary skill in the art that changes and modifications may be made thereto without departing from the scope and the spirit of the invention as hereinafter claimed.

What is claimed is:

1. A driver circuit for switching a supply voltage across as few as one load and as many as three loads, said circuit comprising:
 three non-contiguous high-voltage wells formed within a low-voltage monolithic silicon substrate;
 a high-side driver fabricated within each of the three high-voltage wells, each high-side driver having
  a half bridge consisting of a P-channel metal-oxide-semiconductor field-effect transistor ("MOSFET") in series with an N-channel MOSFET, both MOSFETs sharing a common drain that serves as a driver output, said P-channel MOSFET having a source coupled to a floating supply input, and said N-channel MOSFET having a source coupled to a floating supply return, a half-bridge control module having an output that is coupled to a gate of each MOSFET;

a separate logic input path for each of the high-side drivers, each input path comprising a logic signal input terminal, a signal amplifier, a noise filter, a pulse generator, and a high-voltage level shifter, in that order, wherein the signal amplifier, the noise filter, and the pulse generator of each path are positioned outside of the high-voltage well of their associated driver circuit, and the high-voltage level shifter, which has outputs that are coupled to the half-bridge control module, straddles the low-voltage substrate and the high-voltage well of its associated driver circuit; and an output terminal for each high-side driver, each output terminal coupled to its associated driver output through an output resistor bank having a resistance value that is set with a metal mask during manufacture.

2. The driver circuit of claim 1, wherein said resistor bank comprises a plurality of high-value resistors arranged in parallel, a desired resistance value of the bank being determined by a special fabrication mask which selects particular resistors in the bank to achieve the desired value.

3. The driver circuit of claim 1, which further comprises terminals for supply and return connections of a high-side floating supply voltage for each high-side driver.

4. The driver circuit of claim 3, wherein the high-side driver is packaged as a Small Outline Integrated Circuit ("SOIC"), with duplicate terminals being provided for at least some of the supply and return connections, thereby facilitating connections to power switches and sources from multiple sides of the SOIC, reducing parasitic elements that may adversely affect circuit performance in sensitive applications, as well as lowering operational noise and improving efficiency of the driver circuit.

5. The driver circuit of claim 1, which further comprises under-voltage detection and control circuitry located within each high-voltage well, said under-voltage detection and control circuitry preventing a driver output associated with that high-voltage well from turning on if a supply voltage is below a level required for efficient operation in turning on an external power switch that is controlled by the driver output.

6. The driver circuit of claim 5, wherein any deviations in the supply voltage from the required level which are less than a predetermined time interval are ignored, while deviations in the supply voltage from the required level which are greater than the predetermined time causes a disabling of the driver output until the deviations cease.

7. The driver circuit of claim 1, which further comprises an embedded capacitor bank in at least two of the high-voltage wells, each capacitor bank being in close proximity to one of three high-side switches that will be controlled by an output provided by one of said output terminals, thereby reducing capacitive, resistive, and inductive losses associated with long metal lines.

8. The driver circuit of claim 7, wherein said embedded capacitor banks also eliminate occurrences of false under-voltage lockouts.

9. The driver circuit of claim 1, wherein the noise filter in each input path eliminates occurrences of false turn-on and false turn-off of the high-side driver associated with that input path.

10. The driver circuit of claim 1, wherein noise filtering provided by the three noise filters is asymmetric so as more effectively eliminate false high-side turn on of each of the high-side drivers.

11. A driver circuit for controlling up to three high-side switches, each of which can apply a supply voltage across load, said circuit comprising:

three non-contiguous high-voltage wells formed within a low-voltage monolithic silicon substrate;

a high-side driver fabricated within each of the three high-voltage wells, each high-side driver having a half bridge consisting of a P-channel metal-oxide-semiconductor field-effect transistor ("MOSFET") in series with an N-channel MOSFET, both MOSFETs sharing a common drain that serves as a driver output to a gate of a high-voltage transistor switch, said P-channel MOSFET having a source coupled to a floating supply input, and said N-channel MOSFET having a source coupled to a floating supply return, a half-bridge control module having an output that is coupled to a gate of each MOSFET;

a separate logic input path for each of the high-side drivers, each input path comprising a logic signal input terminal, a signal amplifier, a noise filter, a pulse generator, and a high-voltage level shifter, in that order, wherein the signal amplifier, the noise filter, and the pulse generator of each path are positioned outside of the high-voltage well of their associated driver circuit, and the high-voltage level shifter, which has outputs that are coupled to the half-bridge control module, straddles the low-voltage substrate and the high-voltage well of its associated driver circuit; and an under-voltage detect module having an input coupled to the source of the P-channel MOSFET and an output coupled to the half-bridge control module, said under-voltage detect module preventing activation of the half-bridge control module whenever a voltage level at the floating supply input is inadequate for driving the high-side switches.

12. The driver circuit of claim 11, wherein any deviations in the supply voltage from the required level which are less than a predetermined time interval are ignored, while deviations in the supply voltage from the required level which are greater than the predetermined time causes a disabling of the driver output until the deviations cease.

13. The driver circuit of claim 11, which further comprises an embedded capacitor bank in at least two of the high-voltage wells, each capacitor bank being in close proximity to one of the three high-side switches that will be controlled by a single driver output, thereby reducing capacitive and resistance losses associated with long metal lines.

14. The driver circuit of claim 13, wherein said embedded capacitor banks also eliminate occurrences of false under-voltage lockouts.

15. The driver circuit of claim 11, wherein the noise filter in each input path is designed to eliminate false turn-on and false turn-off of the high-side driver associated with that input path.

16. The driver circuit of claim 11, wherein noise filtering provided by the three noise filters is asymmetric so as more effectively eliminate false high-side turn on of each of the high-side drivers.

17. The driver circuit of claim 11, which further comprises an output terminal for each high-side driver, each output terminal coupled to its associated driver output through an output resistor bank having a resistance value that is set with a metal mask during manufacture.

18. A driver circuit for controlling three high-side switches, each of which can apply a supply voltage to one of three windings of a three-phase brushless DC motor at predefined intervals, said circuit comprising:

three non-contiguous high-voltage wells formed within a low-voltage monolithic silicon substrate;

a high-side driver fabricated within each of the three high-voltage wells, each high-side driver having a half bridge consisting of a P-channel metal-oxide-semiconductor field-effect transistor ("MOSFET") in series with an N-channel MOSFET, both MOSFETs sharing a common drain that serves as a driver output to a gate of a high-voltage transistor switch, said P-channel MOSFET having a source coupled to a floating supply input, and said N-channel MOSFET having a source coupled to a floating supply return, a half-bridge control module having an output that is coupled to a gate of each MOSFET;

a separate logic input path for each high-side driver, each input path comprising a logic signal input terminal, a signal amplifier, a noise filter, a pulse generator, and a high-voltage level shifter, in that order, wherein the signal amplifier, the noise filter, and the pulse generator of each path are positioned outside of the high-voltage well of their associated driver circuit, and the high-voltage level shifter, which has outputs that are coupled to the half-bridge control module, straddles the low-voltage substrate and the high-voltage well of its associated driver circuit; and an under-voltage detect module for each high-side driver circuit, said under-voltage detect module having an input coupled to the source of the P-channel MOSFET and an output coupled to the half-bridge control module, said under-voltage detect module preventing activation of the half-bridge control module whenever a voltage level at the floating supply input is inadequate for driving the high-side switches, each under-voltage detect module also incorporating timing components which create non-symmetric turn-on and turn-off threshold voltage values that reduce occurrences of false turn-ons and turn-offs of the associated high-side driver circuit.

19. The driver circuit of claim 18, which further comprises:

an output terminal for each high-side driver, each output terminal coupled to its associated driver output through an output resistor bank having a resistance value that is set with a metal mask during manufacture; and an embedded capacitor bank in at least two of the high-voltage wells, each capacitor bank providing a reduction of capacitive and resistive losses associated with long metal lines that may be required to connect the output to of an associated high-side driver to a high-side switch.

20. The driver circuit of claim 18, where the filter for output turn-on is wider than the filter for output turn-off.

* * * * *